(12) United States Patent
Kim

(10) Patent No.: US 6,753,652 B2
(45) Date of Patent: Jun. 22, 2004

(54) ION IMPLANTER

(75) Inventor: Won-Ju Kim, Yongin-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/156,956

(22) Filed: May 30, 2002

(65) Prior Publication Data

US 2002/0180366 A1 Dec. 5, 2002

(30) Foreign Application Priority Data

May 30, 2001 (KR) .......................................... 2001-29914

(51) Int. Cl.$^7$ ............................. H01J 7/24; G01N 21/00
(52) U.S. Cl. ............................. 315/111.81; 315/111.61; 250/453.11; 250/423 R
(58) Field of Search ....................... 315/111.81, 111.31, 315/111.91, 111.61; 250/423 R, 492.21, 397, 492.2, 453.11, 453.1; H01J 7/24; G01N 21/08

(56) References Cited

U.S. PATENT DOCUMENTS

| | | | | |
|---|---|---|---|---|
| 4,234,797 A | * | 11/1980 | Ryding | 250/492.3 |
| 4,965,862 A | * | 10/1990 | Freytsis et al. | 250/453.11 |
| 5,229,615 A | * | 7/1993 | Brune et al. | 250/492.2 |
| 5,838,112 A | * | 11/1998 | Tsukakoshi et al. | 315/111.81 |
| 5,981,961 A | * | 11/1999 | Edwards et al. | 250/492.21 |
| 6,084,240 A | * | 7/2000 | Lin et al. | 250/443.1 |
| 6,333,510 B1 | * | 12/2001 | Watanabe et al. | 250/559.27 |
| 6,449,296 B1 | * | 9/2002 | Hamasaki et al. | 372/36 |
| 6,525,327 B1 | * | 2/2003 | Mitchell et al. | 250/492.21 |
| 6,555,832 B1 | * | 4/2003 | Ryding et al. | 250/492.21 |
| 2002/0079465 A1 | * | 6/2002 | Halling | 250/492.21 |

FOREIGN PATENT DOCUMENTS

| JP | 7-65778 | 3/1995 | .......... H01J/37/317 |
|---|---|---|---|

* cited by examiner

*Primary Examiner*—Don Wong
*Assistant Examiner*—Trinh Vo Dinh
(74) *Attorney, Agent, or Firm*—Lee & Sterba, P.C.

(57) ABSTRACT

An ion implanter having means for scanning an ion beam on a wafer is provided, wherein the scanning means, on which the wafer is mounted, moves the wafer in a region where the ion beam is irradiated. A detecting means, which is fixedly mounted adjacent to the scanning means, detects the ion beam that is overly scanned out of the scanning means. The detecting means has an inclined surface so that a portion of the detecting means adjacent to the scanning means is positioned below a surface of the wafer that is disposed on the scanning means. Accordingly, the ion implanter may prevent the wafer in the scanning means from being polluted with sputtering particles generated from a surface of the scanning means.

38 Claims, 7 Drawing Sheets

FIG. 4

| MONTHLY USE (mA-hr EQUIV.AS) | 500 | 1000 | 1500 | 2000 | 2500 |
|---|---|---|---|---|---|
| RESERVED THICKNESS (um) | 67.5 | 135 | 202 | 270 | 338 |
| LIFE(MONTHS) | 32.9 | 15.9 | 10.3 | 7.5 | 5.8 |

ION IMPLANTER

BACKGROUND OF THE INVENTION

1. Field of the Invention

The present invention relates to an ion implanter. More particularly, the present invention relates to an ion implanter capable of effectively reducing sputtering particles therein.

2. Description of the Related Art

Recently, 256 Megabyte DRAM cells have been fabricated by a process satisfying a design rule provided that a width between circuit lines is less than 0.18 μm. However, when the 0.18 μm design rule is applied in the fabrication process, peptides, which are generated in a process chamber, have a tendency to cause defects in semiconductor devices, thereby decreasing a yield of products. Particularly, when 1 Gigabyte DRAM cells or 4 Gigabyte DRAM cells, conventionally known as the next generation memory devices, are developed, the particles generated in the process chamber during fabrication of the devices cause various technical difficulties and fabrication limitations. Hence, the particles are generally recognized as a barrier to be overcome in developing the next generation memory device.

Accordingly, semiconductor device manufacturers have made a great effort and invested significant amounts of time to determine causes of the particles and methods of managing the particles in order to reduce their numbers and to prevent wafer pollution due to the particles in the fabrication of the semiconductor device.

In particular, wafer pollution caused by the particles has a particularly substantial effect on electrical characteristics of a semiconductor device when the particles are generated in an ion implanting process.

According to a conventional ion implanting process, accelerated ions are impacted to the wafer disposed in an ion implanter and then a predetermined amount of ions are implanted to a surface of the wafer at a predetermined depth.

The particles generated in the ion implanter are generally divided into two categories: mechanical particles and electrical particles. Most of the electrical particles are sputtering particles generated by high-speed impact of the ions to a metal surface and activation by an electrostatic force of an ion beam. The mechanical particles are generated by frictional heat due to motion of a rotational device or a transmission system of the ion implanter.

In the case of the mechanical particles, a cause of the particles is easily found and the damage to the wafer is minor. Accordingly, high level technology is not required to trace the mechanical particles in comparison with the electrical particles.

However, in the case of the electrical particles, the electrostatic force of the ion beam consisting of positive ions activates the minute and fine particles and renders the particles to be sputtered. Accordingly, the electrical particles cause significant damage to the wafer and high level technology is required to trace the particles.

SUMMARY OF THE INVENTION

The present invention has been made to solve the aforementioned problem. Accordingly, it is a feature of an embodiment of the present invention to provide an ion implanter capable of analyzing a cause of particles generated therein and restraining generation of the particles by changing a structure of elements of the ion implanter, resulting in a decrease of particle-induced damage of wafers processed therein.

In order to provide these and other features and advantages of the present invention, there is provided an ion implanter having means for scanning an ion beam on a wafer. The scanning means, on which the wafer is mounted, moves the wafer in a region where the ion beam is irradiated. A detecting means, which is fixedly mounted adjacent to the scanning means, detects the ion beam that is overly scanned out of the scanning means. The detecting means has an inclined surface so that a portion of the detecting means adjacent to the scanning means is positioned below a surface of the wafer that is disposed on the scanning means.

According to one embodiment of the present invention, an inclination angle of the inclined surface of the detecting means is limited to approximately 10 degrees to 30 degrees. When the inclination angle is less than 10 degrees, a gradient of the inclined surface is so small that the particles are scattered on the wafer, and thus wafer pollution is not sufficiently prevented. Similarly, when the inclination angle is more than 30 degrees, the gradient of the inclined surface is so large that the secondary electrons generated by sputtering cannot be controlled by means of a faraday cup.

The scanning means may include either a rotary disc applied in a batch type ion implanter or a wafer holder applied in a single type ion implanter. The detecting means preferably includes a spillover cup or a sampling beam cup that is mounted adjacent to the scanning means to detect the ion beam that is overly scanned out of an edge of the scanning means.

BRIEF DESCRIPTION OF THE DRAWINGS

The above and other features and advantages of the present invention will become readily apparent to those of ordinary skill in the art by reference to the following detailed description when considered in conjunction with the accompanying drawings in which:

FIG. 4 illustrates a table of lifetime of the spillover cup corresponding to a generating current for generating the ion beam;

DETAILED DESCRIPTION OF THE INVENTION

Korean Patent Application No. 2001-29914, filed on May 30, 2001, and entitled: "Ion Implanter," is incorporated by reference herein in its entirety.

Hereinafter, the present invention will be described in detail with reference to the accompanying drawings.

Figure 1:
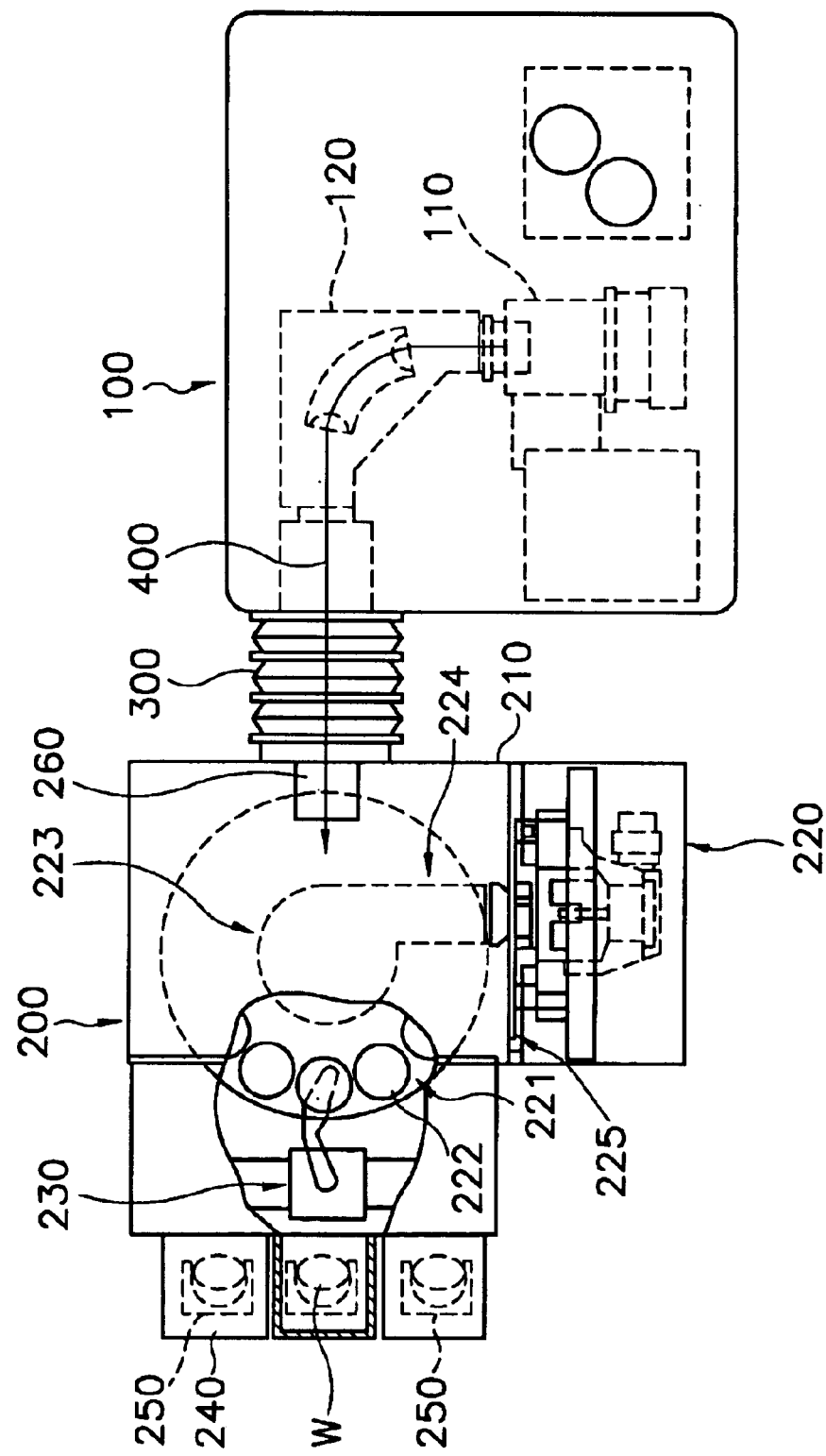
FIG. 1 illustrates a schematic plan view showing a batch type ion implanter.

FIG. 1 illustrates a schematic plan view showing a batch type ion implanter of the prior art to which the present invention may be applied.

A batch type ion implanter refers to a multi-type ion implanter, which holds thirteen to twenty-five wafers in one rotary holder in contrast with a single type ion implanter, which holds only one wafer in one wafer holder.

Referring to FIG. 1, the batch type ion implanter includes a terminal module 100, an end station module 200 and an accelerator 300 for connecting the terminal module 100 and the end station module 200.

The terminal module 100 includes an ion source 110 and a mass analyzer 120. The ion source 110 ionizes a source substance and the mass analyzer 120 separates necessary and unnecessary ions from the ionized source substance. The accelerator 300 generates an ion beam by accelerating the necessary ions separated by the mass analyzer 120 to a voltage of from KeV's to MeV's, and supplies an ion beam 400 to the end station 200.

The end station 200 includes a scanning device 220 and a wafer-transferring device 230 in a high vacuum chamber 210. Before the scanning device 220 implants ions into a wafer W, the wafer-transferring device 230 loads the wafer W from a wafer carrier 250 that is placed on a wafer station 240, to the scanning device 220. After the scanning device 220 implants the ions into the waver W, the wafer-transferring device 230 unloads the wafer W from the scanning device 220 to the wafer carrier 250. The high vacuum chamber 210 is continuously kept in a high vacuum during the implantation process.

Figure 2:
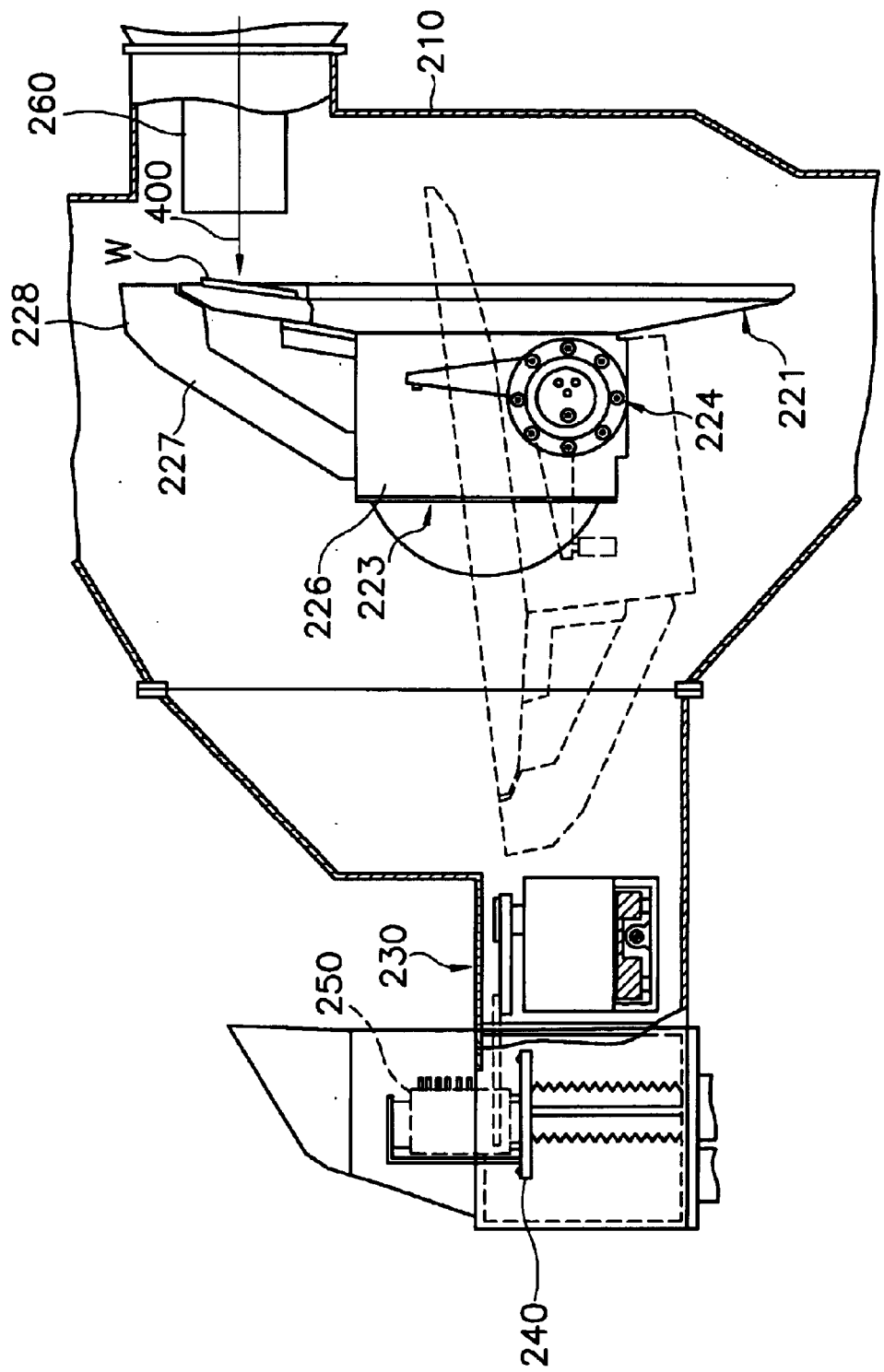
FIG. 2 illustrates a schematic sectional view showing a slide portion of an end station of the batch type ion implanter shown in FIG. 1.

FIG. 2 illustrates a schematic sectional view showing a side portion of the end station module 200 of the batch type ion implanter shown in FIG. 1.

Referring to FIGS. 1 and 2, the scanning device 220 scans the ion beam 400 emitted in a direction of a Z-axis in a two dimensional plane consisting of an X-axis and a Y-axis.

The scanning device 220 includes a disc 221, a disc-driving member 233 for driving the disc 221, a scanning arm 224, a Y-axis driving member 225 for driving the disc 221 in a direction of the Y-axis, a housing 226, a pipe 227 and a detecting device 228 for detecting an ion beam. The disc 221 is rotated on a rotating axis thereof by the disc-driving member 223. A plurality of wafer holders 222 are formed on peripheral portions of the disc 221, and the wafers W are respectively received in each of the wafer holders 222.

The housing 226 is mounted at a free end of the scanning arm 224, and the disc-driving member 223 is installed in the housing 226. The Y-axis driving member 225 is fixed to a fixed end of the scanning arm 224, and thus the scanning arm is moved in the direction of the Y-axis, that is, upwardly and downwardly, according to an operation of the Y-axis driving member 225.

The pipe 227 is connected to an outer surface of the upper peripheral portion of the housing 226 to be extended outwardly. The detecting device 228, for example a spillover cup, is installed to a terminal end of the pipe 227.

The detecting device 228 detects a deviated ion beam that is out of the edge of the disc 221 to improve efficiency of the ion beam.

The ion beam 400 accelerated by the accelerator 300 is emitted in such a manner that the ion beam 400 is irradiated on the wafer W received in the wafer holder 222. A plurality of faraday cups 260 are mounted at a front of the wafer holder 222 and are spaced apart by a predetermined distance from one another and measure an electric current of the ion beam.

An operation of the batch type ion implanter having the above-mentioned construction will now be described.

The scanning arm 224 is rotated sufficiently so that the disc 221 is positioned to be almost horizontal with the wafer transferring device 230. Accordingly, an upper portion of the disc 221 is closely adjacent to the wafer-transferring device 230. Then, a plurality of the wafers W having been received in the wafer-transferring device 230 are transferred into each of the wafer holders 222 by one sheet unit. In other words, when one sheet of the wafer W is transferred into each of the wafer holder 222, the disc 221 is rotated at a predetermined angle so that a next wafer holder is positioned closely adjacent to the wafer transferring device 230 into which another sheet of the wafer W is transferred.

When all of the wafers W are loaded in the wafer holders 222, the scanning arm 224 is rotated in a reverse direction so that the disc 221 is positioned to be almost vertical with the wafer-transferring device 230. Accordingly, the wafer holders 222 are positioned adjacent to the faraday cups 260, so that the ion beam 400 may be irradiated onto the wafer W. Subsequently, the ion beam 400 is irradiated onto the wafers W while the disc 221 is rotated, and thus the ion beam 400 uniformly scans the surfaces of the wafers W.

Possible causes of the particles and potential solutions corresponding to each of the causes of the particles will now be described.

Mechanical particles

Vacuum type particles: When a load lock chamber is locked and a vacuum state is provided therein by dropping an inner pressure of the load lock chamber, moisture is generated on a surface of a wafer that is inside the load lock chamber due to a rapid temperature decrease which occurs in response to the drastic decrease in pressure. Then, the moisture absorbs and deposits particles, which generates vacuum type particles. As a solution for preventing the vacuum type particles, the pressure in the load lock chamber is regulated to drop slowly enough that moisture is not generated on the wafer. Another solution is to purge the wafer with a purging gas, for example a nitrogen gas, before the load lock is locked.

Abrasion type particles: Misalignment of opening portions of the ion implanter, for example faraday cups positioned on a pathway of the ion beam, generates particles composed of Mo, Al and C, referred to as abrasion type particles. The abrasion type particles are low-energy particles and are not deposited on the wafer but merely cover the wafer. A periodic check of alignments of the ion implanter is required for preventing the generation of the abrasive type particles.

Preventive maintenance particles: A defect in preventive maintenance of unit parts of the ion implanter reduces moisture contained in a small gap between the unit parts. At this time, particles such as $H_2O_2$ and aluminum oxide are generated, which are referred to as preventive maintenance particles. An improvement in and a stabilization of the preventive maintenance may prevent the generation of preventive maintenance particles.

Electrical particles

Arc type particles: Arc type particles are composed of Al, Fe, Ti, SUS and the like and generate a long tail on a front surface of a wafer. The arc type particles are high-energy particles. In order to prevent the generation of arc type particles, it is suggested that secondary electrons be restrained from being generated or an electric bias be prevented from being applied to the front surface of the wafer.

Static electricity particles: Static electricity particles are activated particles, composed of C (graphite), for example, due to negative charges. Static electricity particles have strong electro-negativity but merely cover the wafer. In order to prevent the generation of static electricity particles, it is suggested that graphite particles be restrained from being generated and the inside of a vacuum chamber be periodically cleaned out.

Sputtering type particles: Sputtering type particles are generated due to an impact of the ion beam and are composed of C, Al, Fe, Ti, SUS and the like. Sputtering type particles are mainly generated at an edge of the wafer. In order to prevent the generation of sputtering type particles, it is suggested that a stress per second, or a force per second, applied to a unit area of the wafer by minimized by means of regulating an alignment and intensity of the ion beam.

The causes of the particles have been analyzed and significant attention has been devoted to the sputtering particles generated on a surface of the spillover cup since the spillover cup is a main source for supplying metal sputtering particles.

The spillover cup is fixed at an edge of the disc 221 and is continuously subjected to an impact due to the ion beam during an ion implanting process. Therefore, the surface of the spillover cup is sputtered by a relatively continuous impact from the ion beam in comparison with the surface of the disc.

Figure 3:
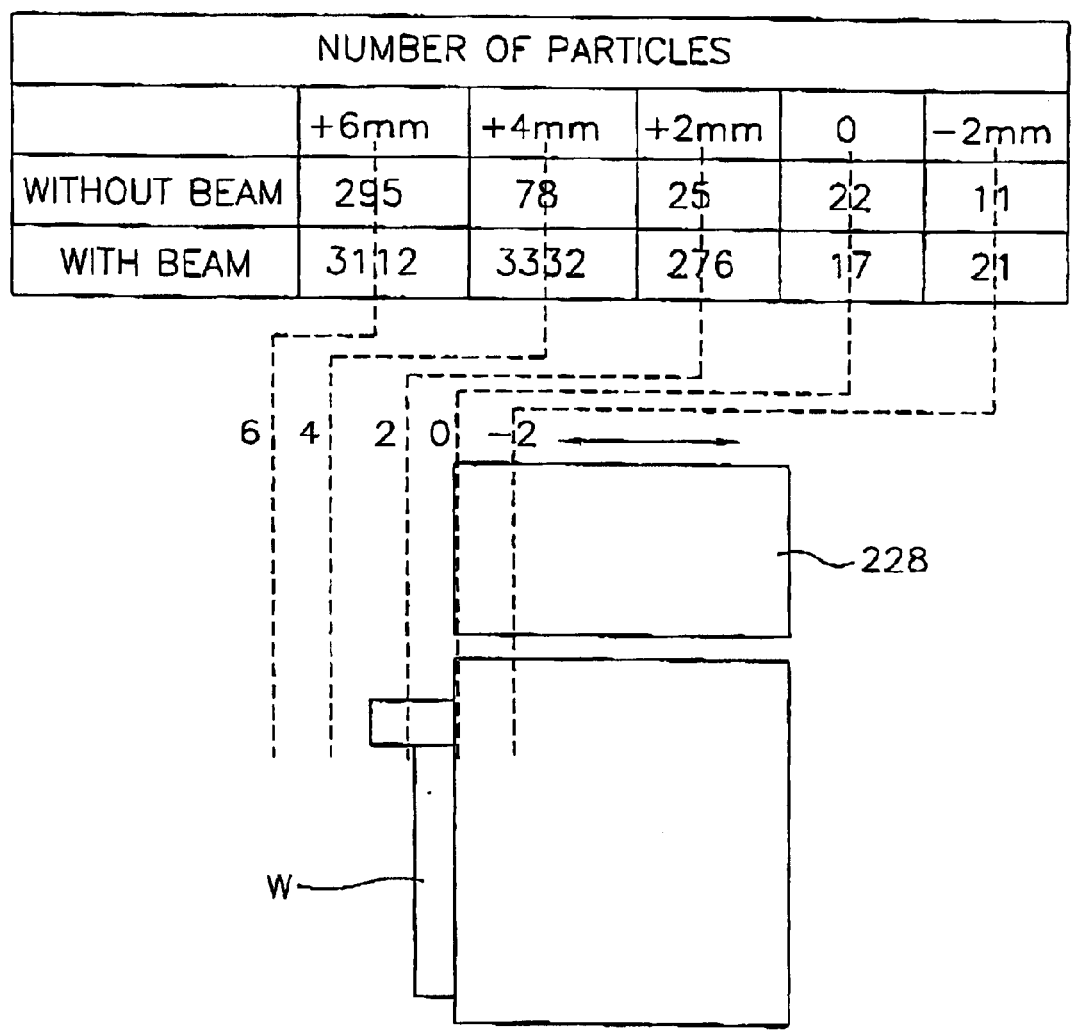
FIG. 3 illustrates a view explaining a change of particle numbers according to a change of a height of a spillover cup from a horizontal surface of the wafer.

FIG. 3 illustrates a view explaining a change in a number of sputtering particles generated on an edge portion of a wafer relative to a change in height of a spillover cup from a horizontal surface of the wafer.

Experimental results regarding an effect on the number of sputtering particles generated as a result of changing the height of the spillover cup with respect to the height of the wafers received in the disc are shown in FIG. 3. Referring to FIG. 3, the height of the spillover cup with respect to the surface of the wafer is directly proportional to the number of sputtering particles generated. In other words, the higher the spillover cup is with respect to the surface of the wafer, the greater the number of sputtering particles generated is, and hence, the greater a degree of pollution on an edge portion of the wafer is due to the sputtering particles.

According to the conventional art, a silicon resin is coated on a surface of the spillover cup formed of aluminum in order to prevent the generation of sputtering particles. However, the silicon resin merely prevents abrasion of the surface of the spillover cup but does not restrain the generation of the sputtering particles.

When the spillover cup is positioned below the surface of the wafer, the degree of pollution of the wafer due to the particles may be further decreased. However, using this conjugation, secondary electrons are difficult to control since the wafer is positioned a large distance from the faraday cup, which is mounted at a front of the ion implanter. Therefore, the spillover cup is preferably positioned above the surface of the wafer.

Figure 5:
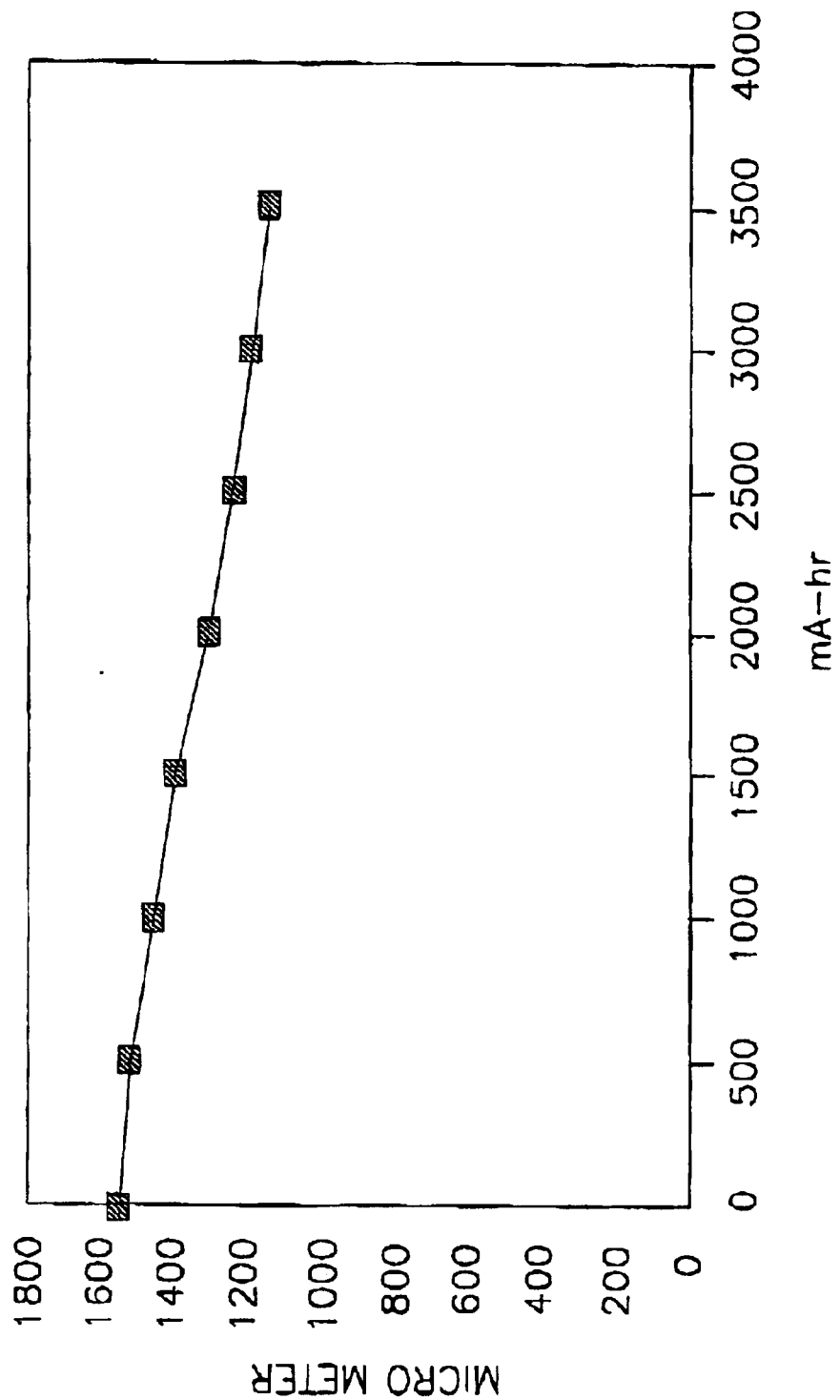
FIG. 5 illustrates a graph showing the relationship between a corrosion rate of the spillover cup and the generating circuit.

FIG. 4 illustrates a table showing a lifetime of the spillover cup 228 with respect to a size of a generating current used for generating the ion beam. FIG. 5 illustrates a graph showing the relationship between a corrosion rate of the spillover cup (in mA-hr) and the size of the generating current (in micrometers).

Increasing the generating current for generating the ion beam increases a power of the ion beam. Therefore, as shown in FIGS. 4 and 5, the higher the generating current for generating the ion beam, the greater the number of particles generated due to the increased power of the ion beam. For example, when an ion beam is emitted to a target region of a wafer, an impact force of an ion beam generated by a generating current of approximately 1 mA to 20 mA is stronger than the impact force of an ion beam generated by a generating current of approximately 10 $\mu$A to 1 mA. Consequently, the stronger the impact force, the higher the corrosion rate and the greater the number of particles generated.

Accordingly, in an ion implanter using a high voltage current, pollution of a wafer due to sputtering particles has an adverse effect on dies adjacent to the wafer, and thus the electrical characteristics of the dies are significantly changed. The change of the electrical characteristics of the dies causes electrical defects in a semiconductor device, and consequently the product yield is decreased.

Figure 6:
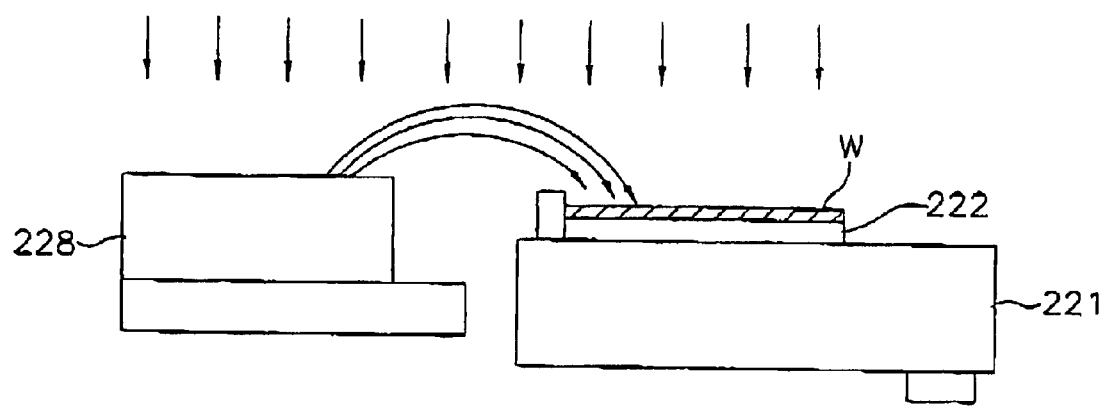
FIG. 6 illustrates a view showing a scattering process of sputtering particles on a flat surface of the spillover cup of a conventional ion implanter; p

FIG. 6 illustrates a view showing a scattering process of sputtering particles on a flat surface of a conventional spillover cup.

Referring to FIG. 6, a surface of the spillover cup 228 is flat. Therefore, when the surface of the spillover cup 228 is positioned higher than a surface of the wafer W due to misalignment, the degree of pollution of the waver W due to sputtering particles becomes high.

In other words, since the surface of the spillover cup 228 is positioned normal to a direction of the ion beam, a scattering angle of the sputtering particles is so large that the particles fall on the adjacent wafer when the ion beam collides against the surface of the wafer.

The spillover cup 228 can hardly be aligned exactly with the surface of the wafer W since the spillover cup 228 is installed at the terminal end of the pipe 227 fixed to the housing 226, as shown in FIG. 2. Even if the spillover cup is originally in perfect alignment with the surface of the wafer, over time, stresses due to vibration or heat expansion of the disc while the disc is rotated usually cause the spillover cup 228 to become misaligned and positioned higher than the surface of the wafer.

Furthermore, a surface of the spillover cup is worn away over time, necessitating periodic replacement of the worn-away spillover cup with a new one. Again, the new spillover cup can hardly be aligned exactly with the surface of the wafer.

Accordingly, in another embodiment of the present invention, an improved spillover cup is provided to solve the problem described above.

Figure 7:
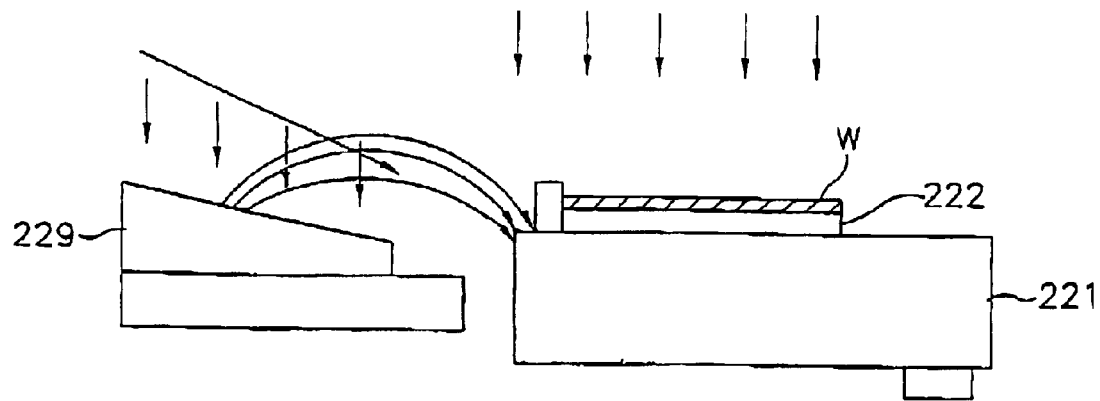
FIG. 7 illustrates a view showing a scattering process of sputtering particles on an inclined surface of the spillover cup of a batch type ion implanter according to an embodiment of the present invention.

FIG. 7 illustrates a view showing a scattering process of sputtering particles on an inclined surface of the spillover cup of a batch type ion implanter according to an embodiment of the present invention.

Referring to FIG. 7, the spillover cup 229 has an inclined surface and is preferably comprised of aluminum. The surface of the spillover cup may be coated with silicon resin. Additionally, the spillover cup 229 may be comprised of vitreous graphite.

A gradient of the inclined surface of the spillover cup 229 is in an angle range of approximately 10 degrees to 30 degrees. The gradient prevents the ion beam from perpendicularly colliding against the surface of the spillover cup, and hence collision energy of the ion beam is dispersed. Furthermore, the scattering angle of the particles is small enough that the particles are not able to cross over and edge of the disc 221. Hence, the particles generated from the surface of the spillover cup disappear after colliding against a side surface of the disc 221. As a result, the number of particles falling on the wafer received in the disc 221 may be significantly reduced.

More particularly, the gradient of the surface of the spillover cup sufficiently reduces a rebounding force of the ion beam below a reference force so that the sputtering particles disappear after colliding against the edge of the disc 221.

When the gradient is less than an angle of 10 degrees, the sputtering particles are scattered over the wafer W since a slope of the surface of the spillover cup is slight, and pollution of the edge portion of the wafer W cannot be significantly improved.

When the gradient is more than an angle of 30 degrees, the particles are not scattered over the wafer W. However, since the secondary electrons generated by the collision of the ion beam cannot reach the faraday cup 260 mounted at a front of the disc 221, the faraday cup cannot be used for controlling the secondary electrons.

In other words, when the spillover cup 229 is far away from the faraday cup 260, a magnetic field is difficult to control, and thus, the secondary electrons are difficult to control.

According to a preferred embodiment of the present invention, the gradient of the surface of the spillover cup 229 is formed with an angle in a range of approximately 10 degrees to 30 degrees, thereby preventing the sputtering particles from being scattered on the wafer W while the secondary electrons are effectively controlled by forming a proper space between the spillover cup and the faraday cup.

Figure 8:
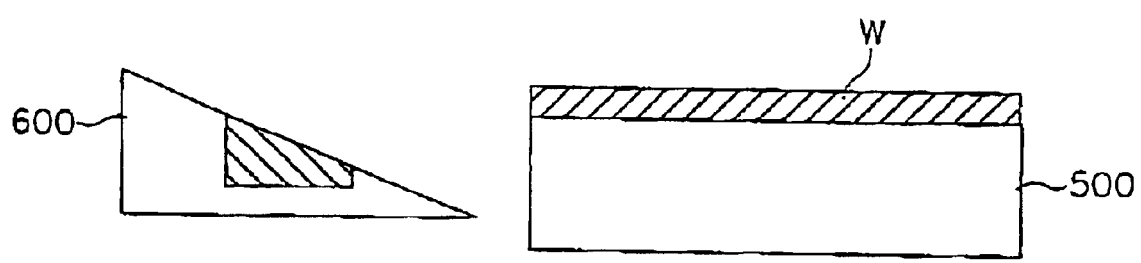
FIG. 8 illustrates a sectional view showing a sampling beam cup of a single type ion implanter according to another embodiment of the present invention.

FIG. 8 illustrates a sectional view showing a sampling beam cup of a single type ion implanter according to another embodiment of the present invention.

The single type ion implanter can hold only one wafer W in the wafer holder 500, contrary to the batch type ion implanter, and scans upward and downward, or leftward and rightward, in the scanning region. Similar to the batch type ion implanter, in the single type ion implanter, a sampling beam cup 600 is also mounted at a position adjacent to the wafer holder 500 for sampling the ion beam emitted on the wafer W.

Referring to FIG. 8, the sampling beam cup 600 has an inclined surface that is formed in a similar way in which the surface of the spillover cup of the batch type ion implanter is formed. Accordingly, the sputtering particles generated from the surface of the sampling beam cup 600 are prevented from being scattered on the wafer W.

According to preferred embodiments of the present invention, a yield of products utilizing semiconductor devices may be greatly improved by reducing the number of sputtering particles generated in the ion implanter in fabricating the semiconductor devices having widths of 0.18 μm or 0.16 μm. Even though the fixed spillover cup is raised above a spin disc due to vibration and heat expansion during the ion implanting process, the sputtering particles may not pollute a surface of the wafer since the surface of the spillover cup is inclined.

Preferred embodiment of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An ion implanter comprising:
    means for scanning an ion beam on a wafer, the scanning means moving the wafer in a region where the ion beam is irradiated, the wafer being mounted on the scanning means; and
    means for detecting any portion of the ion beam that is overly scanned out of the ion beam scanning means, the detecting means being fixedly mounted adjacent to the ion beam scanning means,
    wherein an entire surface of the detecting means that is exposed to the overly scanned portion of the ion beam is inclined, so that a portion of the surface of the detecting means that is exposed to the overly scanned portion of the ion beam and is adjacent to the scanning means is positioned below a surface of the wafer that is disposed on the scanning means.

2. The ion implanter as claimed in claim 1, wherein a gradient of the inclined surface of the detecting means is in an angle range of approximately 10 degrees to 30 degrees.

3. The ion implanter as claimed in claim 1, wherein the detecting means is an aluminum plate having a surface coated with a silicon resin.

4. The ion implanter as claimed in claim 1, wherein the detecting means is comprised of vitreous graphite.

5. The ion implanter as claimed in claim 1, wherein the scanning means has a disc shape for mounting a plurality of wafers thereon.

6. The ion implanter as claimed in claim 1, wherein the ion implanter is a single type ion implanter.

7. The ion implanter as claimed in claim 6, wherein the scanning means includes a wafer holder.

8. The ion implanter as claimed in claim 6, wherein the detecting means includes a spillover cup.

9. The ion implanter as claimed in claim 8, wherein the spillover cup is comprised of aluminum.

10. The ion implanter as claimed in claim 8, wherein the spillover cup has a surface coated with a silicon resin.

11. The ion implanter as claimed in claim 8, wherein the spillover cup is comprised of vitreous graphite.

12. The ion implanter as claimed in claim 8, wherein the spillover cup has an inclined surface.

13. The ion implanter as claimed in claim 12, wherein a gradient of the inclined surface of the spillover cup is in an angle range of approximately 10 degrees to 30 degrees.

14. The ion implanter as claimed in claim 6, wherein the detecting means includes a sampling beam cup for sampling the ion beam scanned on the wafer.

15. The ion implanter as claimed in claim 14, wherein the sampling beam cup has an inclined surface.

16. The ion implanter as claimed in claim 15, wherein a gradient of the inclined surface of the sampling beam cup is an angle range of approximately 10 degrees to 30 degrees.

17. The ion implanter as claimed in claim 1, wherein the ion implanter is a batch type ion implanter.

18. The ion implanter as claimed in claim 17, wherein the scanning means includes a rotary disc.

19. The ion implanter as claimed in claim 17, wherein the detecting means includes a spillover cup.

20. The ion implanter as claimed in claim 19, wherein the spillover cup is comprised of aluminum.

21. The ion implanter as claimed in claim 19, wherein the spillover cup has a surface coated with a silicon resin.

22. The ion implanter as claimed in claim 19, wherein the spillover cup is comprised of vitreous graphite.

23. The ion implanter as claimed in claim 19, wherein the spillover cup has an inclined surface.

24. The ion implanter as claimed in claim 23, wherein a gradient of the inclined surface of the spillover cup is in an angle range of approximately 10 degrees to 30 degrees.

25. The ion implanter as claimed in claim 17, wherein the detecting means including a sampling beam cup for sampling the ion beam scanned on the wafer.

26. The ion implanter as claimed in claim 25, wherein the sampling beam cup has an inclined surface.

27. The ion implanter as claimed in claim 26, wherein a gradient of the inclined surface of the sampling beam cup is in an angle range of approximately 10 degrees to 30 degrees.

28. The ion implanter as claimed in claim 1, wherein the scanning means includes a rotary disc applied in a batch type ion implanter.

29. The ion implanter as claimed in claim 1, wherein the scanning means includes a wafer holder applied in a single type ion implanter.

30. The ion implanter as claimed in claim 1, wherein the detecting means includes a spillover cup.

31. The ion implanter as claimed in claim 30, wherein the spillover cup has an inclined surface.

32. The ion implanter as claimed in claim 31, wherein a gradient of the inclined surface of the spillover cup is an angle range of approximately 10 degrees to 30 degrees.

33. The ion implanter as claimed in claim 30, wherein the spillover cup is comprised of aluminum.

34. The ion implanter as claimed in claim 33, wherein the spillover cup has a surface coated with a silicon resin.

35. The ion implanter as claimed in claim 30, wherein the spillover cup is comprised of vitreous graphite.

36. The ion implanter as claimed in claim 1 wherein the detecting means includes a sampling beam cup for sampling the ion beam scanned on the wafer.

37. The ion implanter as claimed in claim 36, wherein the sampling beam cup has an inclined surface.

38. The ion implanter as claimed in claim 37, wherein a gradient of the inclined surface of the sampling beam cup is in an angle range of approximately 10 degrees to 30 degrees.

* * * * *